United States Patent
Cremer et al.

(10) Patent No.: US 11,556,304 B2
(45) Date of Patent: Jan. 17, 2023

(54) DETECTION OF VOLUME ADJUSTMENTS DURING MEDIA REPLACEMENT EVENTS USING LOUDNESS LEVEL PROFILES

(71) Applicant: Roku, Inc., San Jose, CA (US)

(72) Inventors: Markus K. Cremer, Orinda, CA (US); Shashank Merchant, Sunnyvale, CA (US); Robert Coover, Orinda, CA (US); Todd J. Hodges, Oakland, CA (US); Joshua Ernest Morris, Oakland, CA (US)

(*) Notice: Subject to any disclaimer, the term of this patent is extended or adjusted under 35 U.S.C. 154(b) by 0 days.

(21) Appl. No.: 17/350,557

(22) Filed: Jun. 17, 2021

(65) Prior Publication Data

US 2021/0311697 A1 Oct. 7, 2021

Related U.S. Application Data

(63) Continuation of application No. 16/684,510, filed on Nov. 14, 2019, now Pat. No. 11,068,232.

(Continued)

(51) Int. Cl.
*G06F 3/16* (2006.01)
*H04N 21/439* (2011.01)
(Continued)

(52) U.S. Cl.
CPC ............... *G06F 3/165* (2013.01); *G06N 3/08* (2013.01); *H03G 3/24* (2013.01); *H03G 3/3005* (2013.01);
(Continued)

(58) Field of Classification Search
CPC ...... H03G 3/24; H03G 3/3005; H03G 3/3089; H04N 5/147; H04N 21/439; H04N 21/812; G06N 3/08; G06F 3/165
See application file for complete search history.

(56) References Cited

U.S. PATENT DOCUMENTS 5,822,018 A * 10/1998 Farmer ............... H04N 21/812
348/E7.054
11,068,232 B2 7/2021 Cremer et al.
(Continued)

FOREIGN PATENT DOCUMENTS

JP 2017169159 A 9/2017

OTHER PUBLICATIONS

International Search Report received for PCT Patent Application No. PCT/US2019/061633, dated Mar. 5, 2020, 5 pages.
(Continued)

*Primary Examiner* — Jason R Kurr
(74) *Attorney, Agent, or Firm* — Sterne, Kessler, Goldstein & Fox P.L.L.C.

(57) ABSTRACT

In one aspect, an example method includes (i) determining, by a playback device, a loudness level of first media content that the playback device is receiving from a first source; (ii) comparing, by the playback device, the determined loudness level of the first media content with a reference loudness level indicated by a loudness level profile for the first media content; (iii) determining, by the playback device, a target volume level for the playback device based on a difference between the determined loudness level of the first media content and the reference loudness level; and (iv) while the
(Continued)

playback device presents second media content from a second source in place of the first media content, adjusting, by the playback device, a volume of the playback device toward the target volume level.

20 Claims, 5 Drawing Sheets

Related U.S. Application Data (60) Provisional application No. 62/909,676, filed on Oct. 2, 2019, provisional application No. 62/861,474, filed on Jun. 14, 2019, provisional application No. 62/768,596, filed on Nov. 16, 2018.

(51) Int. Cl.
| | | |
|---|---|---|
| *H04N 21/81* | (2011.01) | |
| *H03G 3/24* | (2006.01) | |
| *H03G 3/30* | (2006.01) | |
| *G06N 3/08* | (2006.01) | |
| *H04N 5/14* | (2006.01) | |

(52) U.S. Cl.
CPC ........... *H03G 3/3089* (2013.01); *H04N 5/147* (2013.01); *H04N 21/439* (2013.01); *H04N 21/812* (2013.01)

(56) References Cited

U.S. PATENT DOCUMENTS

| | | | |
|---|---|---|---|
| 2012/0063615 A1* | 3/2012 | Crockett | H03G 5/165 |
| | | | 381/98 |
| 2012/0250895 A1 | 10/2012 | Katsianos | |
| 2017/0302241 A1* | 10/2017 | Knee | H03G 9/025 |
| 2017/0311107 A1 | 10/2017 | Ward et al. | |
| 2018/0069517 A1 | 3/2018 | Crockett et al. | |
| 2018/0218742 A1 | 8/2018 | Baumgarte | |
| 2018/0234728 A1 | 8/2018 | Hwang et al. | |
| 2019/0190477 A1* | 6/2019 | Travaglini | H03G 3/3005 |
| 2019/0214954 A1 | 7/2019 | Coover et al. | |
| 2020/0162049 A1 | 5/2020 | Cremer et al. | |

OTHER PUBLICATIONS

Written Opinion received for PCT Patent Application No. PCT/US2019/061633, dated Mar. 5, 2020, 7 pages.

Office Action for U.S. Appl. No. 16/684,510 dated Dec. 11, 2020, 20 pages.

Non-Final Office Action dated Dec. 11, 2020 and issued in connection with U.S. Appl. No. 16/684,510, 20 pages.

\* cited by examiner

DETECTION OF VOLUME ADJUSTMENTS DURING MEDIA REPLACEMENT EVENTS USING LOUDNESS LEVEL PROFILES

CROSS-REFERENCE TO RELATED APPLICATIONS

This disclosure is a continuation of U.S. patent application Ser. No. 16/684,510, filed on Nov. 14, 2019, which claims priority to U.S. Provisional Patent App. No. 62/768,596, filed on Nov. 16, 2018, U.S. Provisional Patent App. No. 62/861,474, filed on Jun. 14, 2019, and U.S. Provisional Patent App. No. 62/906,676, filed on Oct. 2, 2019, each of which is hereby incorporated by reference in its entirety.

USAGE AND TERMINOLOGY

In this disclosure, unless otherwise specified and/or unless the particular context clearly dictates otherwise, the terms "a" or "an" mean at least one, and the term "the" means the at least one.

In this disclosure, the term "connection mechanism" means a mechanism that facilitates communication between two or more components, devices, systems, or other entities. A connection mechanism can be a relatively simple mechanism, such as a cable or system bus, or a relatively complex mechanism, such as a packet-based communication network (e.g., the Internet). In some instances, a connection mechanism can include a non-tangible medium (e.g., in the case where the connection is wireless).

In this disclosure, the term "computing system" means a system that includes at least one computing device. In some instances, a computing system can include one or more other computing systems.

BACKGROUND

In coming years, the replacement of advertisements in media content with targeted advertisements is expected to become an increasingly important advertising method. By way of example, in a dynamic advertisement insertion (DAI) system, a content provider can insert generic advertisements into advertisement-breaks that interrupt sequences of media content, such as live or pre-recorded content. Each advertisement-break can include a set of advertisements arranged in a predetermined order. Further, a particular one of the advertisements can be designated or dynamically selected to be replaced with replacement media content, such as a targeted advertisement.

With this arrangement, prior to displaying the particular advertisement, the playback device can obtain the replacement media content, and then provide the replacement media content for display instead of the particular advertisement. For instance, responsive to determining that the playback device is playing or about to play content immediately preceding the particular advertisement to be replaced, the playback device can retrieve a targeted advertisement from a database, and then provide the targeted advertisement for display in place of the particular advertisement at the appropriate time.

SUMMARY

In one aspect, an example method is disclosed. The method includes (i) determining, by a playback device, a loudness level of first media content that the playback device is receiving from a first source; (ii) comparing, by the playback device, the determined loudness level of the first media content with a reference loudness level indicated by a loudness level profile for the first media content; (iii) determining, by the playback device, a target volume level for the playback device based on a difference between the determined loudness level of the first media content and the reference loudness level; and (iv) while the playback device presents second media content from a second source in place of the first media content, adjusting, by the playback device, a volume of the playback device toward the target volume level.

In another aspect, an example non-transitory computer-readable medium is disclosed. The computer-readable medium has stored thereon program instructions that upon execution by a processor, cause performance of a set of acts including (i) determining a loudness level of first media content that a playback device is receiving from a first source; (ii) comparing the determined loudness level of the first media content with a reference loudness level indicated by a loudness level profile for the first media content; (iii) determining a target volume for the playback device based on a difference between the determined loudness level of the first media content and the reference loudness level; and (iv) while the playback device presents second media content from a second source in place of the first media content, adjusting a volume of the playback device toward the target volume level.

In another aspect, an example computing system is disclosed. The computing system is configured for performing a set of acts including (i) determining a loudness level of first media content that a playback device is receiving from a first source; (ii) comparing the determined loudness level of the first media content with a reference loudness level indicated by a loudness level profile for the first media content; (iii) determining a target volume for the playback device based on a difference between the determined loudness level of the first media content and the reference loudness level; and (iv) while the playback device presents second media content from a second source in place of the first media content, adjusting a volume of the playback device toward the target volume level.

DETAILED DESCRIPTION

I. Overview

During a media content replacement event on a playback device, second media content (i.e. replacement media content) is presented in lieu of a portion of first media content. For instance, during a media content replacement event, a segment of first media content received from a first source is replaced with second media content received from a second source. To effect the replacement, the playback device can switch from presenting first media content that is received from the first source to presenting second media content that is received from the second source. In some cases, this switching of sources may be imperceptible to a user.

Furthermore, in some cases, during a media content replacement event in which the playback device presents the second media content from the second source in place of the first media content from the first source, any volume playback information of the first source might not be accessible to the playback device. For instance, the volume playback information of the first source may be set by a device providing an audio signal to the playback device, and the volume playback information might not be accessible to the playback device. As a consequence, during a media content replacement event, if a user attempts to adjust a volume of the playback device using a remote control that can control the device providing the audio signal to the playback device, the intended adjustment might not be accessible to the playback device. For instance, if the user attempts to increase or decrease the volume, information regarding the requested change might not be accessible to the playback device, and the playback device may nevertheless continue presenting the second media content, which is the replacement, at a same volume level. To the user attempting to adjust the volume, it may appear as if the remote control is malfunctioning or as if the playback device is not responding to the attempted volume adjustment. This can lead to a poor or frustrating user-experience for the viewer.

Disclosed herein are methods and systems to address this and potentially other issues. In accordance with this disclosure, during a media content replacement event, a playback device can use loudness data received from a server to detect and respond to user-triggered volume adjustments to first media content that the playback device is replacing with second media content. In an example method, a playback device can determine a loudness level of first media content that the playback device is receiving from a first source. The playback device can then compare the determined loudness level of the first media content on the playback device with a reference loudness level indicating what the original loudness level profile for the first media content was before changes on the playback device. Further, the playback device can determine a target volume level for the playback device based on a difference between the determined loudness level of the first media content and the reference loudness level. While the playback device presents second media content from a second source in place of the first media content, the playback device can adjust a volume of the playback device toward the target volume level. In one example, this movement to the target volume can be implemented using a smoothing filter.

The loudness level profile for the first media content can include respective loudness levels for portions of the first media content. By comparing the determined loudness level of the first media content with a corresponding reference loudness level indicated by the loudness level profile, the playback device can detect a user-triggered volume adjustment to the first media content. Advantageously, the playback device can then respond to the detected user-triggered volume adjustment by carrying out a corresponding volume adjustment to the second media content by smoothly changing the volume to the new user-selected target.

While portions of this disclosure refer to a media content replacement event involving an advertisement, the examples are not meant to be limiting. The systems and methods disclosed herein are also applicable to replacing any content segment that is part of a content stream from one source with a content segment from another source. Other types of replaceable content can include weather segments, news segments, sports segments, radio advertisements, etc. The content stream that includes replaceable content can also be provided from a variety of sources, such as server or URL on the internet. Thus, the examples provided below are not meant to be limiting.

II. Example Architecture

A. Computing Device

Figure 1:
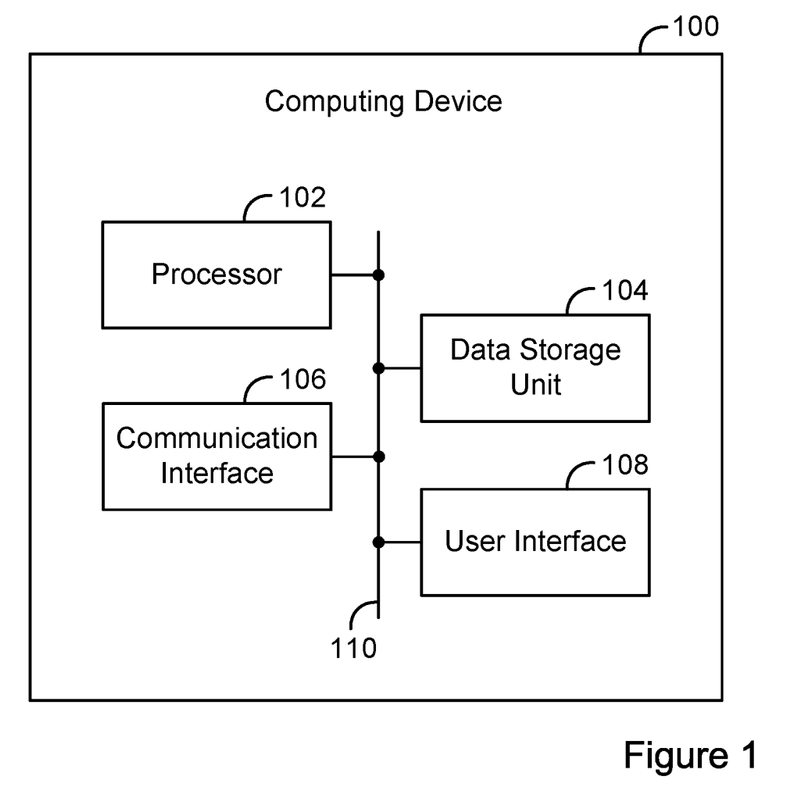
FIG. 1 is a simplified block diagram of an example computing device.

FIG. 1 is a simplified block diagram of an example computing device 100. Computing device 100 can perform various acts and/or functions, such as those described in this disclosure. Computing device 100 can include various components, such as processor 102, data storage unit 104, communication interface 106, and/or user interface 108. These components can be connected to each other (or to another device, system, or other entity) via connection mechanism 110.

Processor 102 can include a general-purpose processor (e.g., a microprocessor) and/or a special-purpose processor (e.g., a digital signal processor (DSP)).

Data storage unit 104 can include one or more volatile, non-volatile, removable, and/or non-removable storage components, such as magnetic, optical, or flash storage, and/or can be integrated in whole or in part with processor 102. Further, data storage unit 104 can take the form of a non-transitory computer-readable storage medium, having stored thereon program instructions (e.g., compiled or non-compiled program logic and/or machine code) that, when executed by processor 102, cause computing device 100 to perform one or more acts and/or functions, such as those described in this disclosure. As such, computing device 100 can be configured to perform one or more acts and/or functions, such as those described in this disclosure. Such program instructions can define and/or be part of a discrete software application. In some instances, computing device 100 can execute program instructions in response to receiving an input, such as from communication interface 106 and/or user interface 108. Data storage unit 104 can also store other types of data, such as those types described in this disclosure.

Communication interface 106 can allow computing device 100 to connect to and/or communicate with another entity according to one or more protocols. In one example, communication interface 106 can be a wired interface, such as an Ethernet interface or a high-definition serial-digital-interface (HD-SDI). In another example, communication interface 106 can be a wireless interface, such as a cellular or WI-FI interface. In this disclosure, a connection can be a direct connection or an indirect connection, the latter being a connection that passes through and/or traverses one or more entities, such as a router, switcher, or other network device. Likewise, in this disclosure, a transmission can be a direct transmission or an indirect transmission.

User interface 108 can facilitate interaction between computing device 100 and a user of computing device 100, if applicable. As such, user interface 108 can include input components such as a keyboard, a keypad, a mouse, a touch-sensitive panel, a microphone, and/or a camera, and/or output components such as a display device (which, for example, can be combined with a touch-sensitive panel), a sound speaker, and/or a haptic feedback system. More generally, user interface 108 can include hardware and/or software components that facilitate interaction between computing device 100 and the user of the computing device 100.

Computing device 100 can take various forms, such as a workstation terminal, a desktop computer, a laptop, a tablet, a mobile phone, or a television.

B. Dynamic Advertisement Insertion (DAI) System

Figure 2:
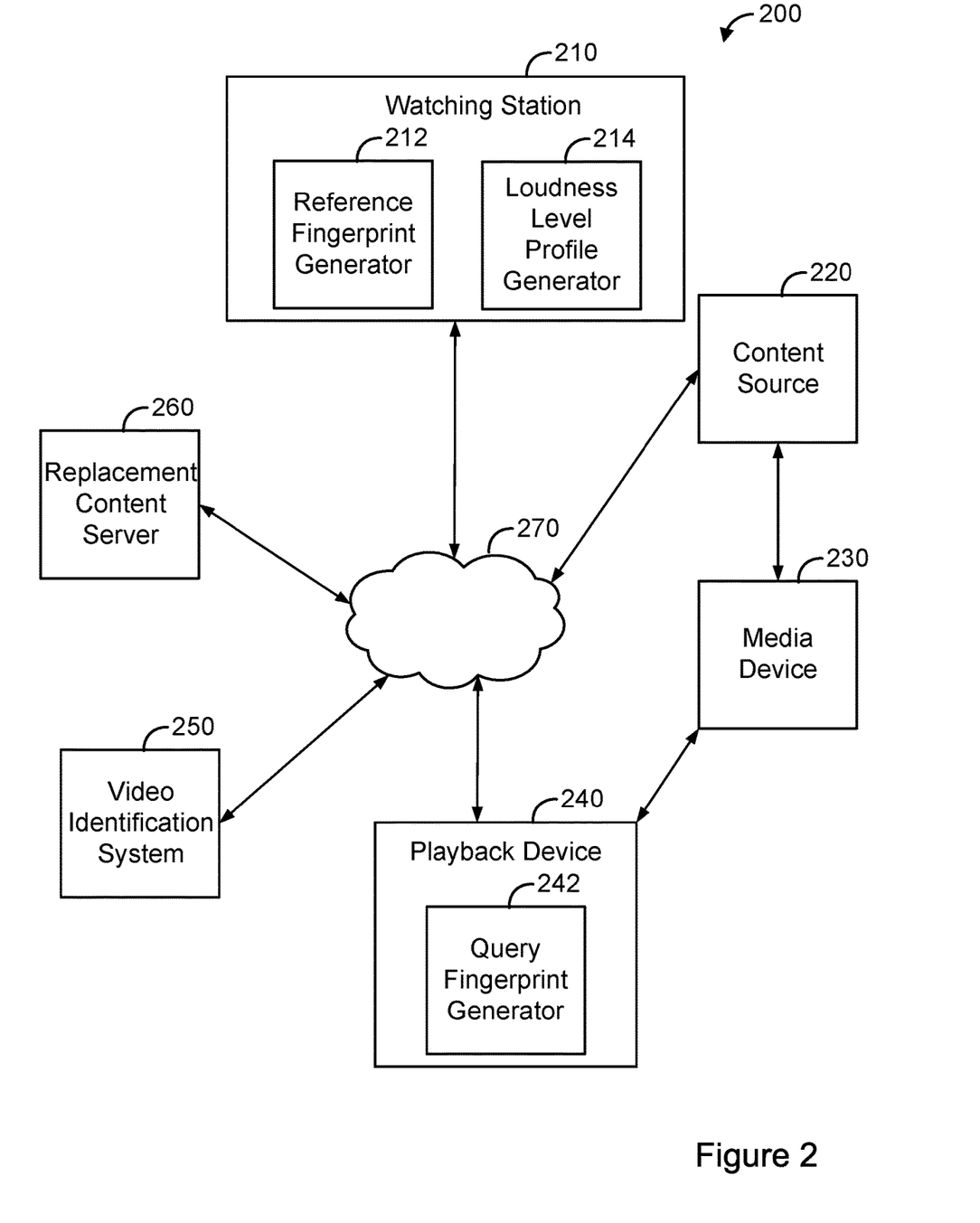
FIG. 2 is a simplified block diagram of an example dynamic advertisement insertion (DAI) system.

FIG. 2 is a simplified block diagram of an example DAI system 200. The DAI system 200 can perform various acts and/or functions related to the delivery and/or presentation of media content (e.g., audio content and/or video content), and can be implemented as a computing system.

DAI system 200 can include various components, such as a watching station 210, a content source 220, a media device 230, a playback device 240, a video identification system 250, and a replacement content server 260, each of which can be implemented as a computing system.

Watching station 210 can receive video and other multimedia content from content source 220, such as a broadcaster, web server, or cable television (TV) station. For example, content source 220 may be a broadcaster, such as a TV station or TV network, which streams or transmits media over a TV channel to watching station 210, and/or a web service, such as a website, that streams or transmits media over a network 270 to watching station 210. Watching station 210 includes a reference fingerprint generator 212 that generates reference fingerprints of video content received from content source 220. Watching station 210 can send generated reference fingerprints to video identification system 250.

Watching station 210 also includes a loudness level profile generator 214. Alternatively, loudness level profile generator 214 can be part of another computing system that is separate from watching station 210. Loudness level profile generator 214 can generate loudness level profiles for segments of media content. By way of example, loudness level profile generator 214 can generate loudness level profiles for replaceable advertisements that are replaced with replacement advertisements during media content replacement events.

A loudness level profile can characterize how loudness changes over time in a segment of media content. For instance, a loudness level profile can include respective loudness levels (e.g., root mean square (RMS) loudness levels or loudness, K-weighted, relative to full scale (LKFS) loudness levels) for different portions of the segment of media content. As one example, a loudness level profile for a thirty-second advertisement can include a sequence of loudness levels corresponding to portions of the advertisement. The portions could be overlapping or distinct from one another. For instance, each loudness level can be a moving average that is calculated based on characteristics of the audio signal for the advertisement during a fixed-length portion (e.g., half of a second, one second, etc.).

In some implementations, an initial loudness level for an advertisement can be calculated based on a RMS of an initial one-second portion of the audio signal. Then a subsequent loudness level can be calculated based on a subsequent one-second portion of the audio signal. Alternatively, in other implementations, an initial loudness level can be calculated based on a RMS of an initial three-second portion of the audio signal. Then a subsequent loudness level can be calculated based on a subsequent three-second portion of the audio signal, with a portion of the subsequent three-second portion overlapping a portion of the initial three-second portion. For example, the subsequent three-second portion can include the last two seconds of the initial portion, as well as an additional portion that is subsequent to the initial portion.

Loudness level profile generator 214 can calculate the loudness levels of a loudness level profile using a loudness meter. The loudness meter can include a software module configured to execute on watching station 210. The software module can execute various filtering algorithms, such as those recommended by the International Telecommunication Union, to determine the loudness level. The software module can measure individual loudness levels of multiple channels of an audio signal, and then average and sum the individual loudness levels to arrive at a loudness level.

Loudness level profile generator 214 can generate an index of loudness level profiles. For instance, loudness level profile generator 214 can store generated loudness level profiles in association with corresponding identifiers for the segments of media content from which the loudness level profiles are generated. Watching station 210 can send generated loudness level profiles to video identification system 250, playback device 240, replacement content server 260, and/or another computing system.

Media device 230 can receive the video and other multimedia content from content source 220, such as via a broadcast channel and/or over network 270. Media device 230 can modify the received content before sending content to playback device 240. Media device 230 can include a tuner configured to receive an input stream of video content and generate an output stream of video content by processing the input stream. Media device 230 can be a device equipped with tuners, decoders, and other hardware and/or software such that media device 230 can access video content through a video content distribution network, such as a terrestrial broadcast, cable, and/or satellite broadcast network employed by multichannel video programming distributors. Additionally or alternatively, media device 230 can be a device equipped with network adapters, decoders, and other hardware and/or software such that media device 230 can access video content through a wide area network (e.g., the internet) employed by devices for accessing internet video streaming services. Media device 230 can output signals (e.g., digital or analog signals) usable by a speaker and display of playback device 240 to present video content to a user.

Playback device 240 is any device capable of receiving and presenting a stream of video and/or other multimedia content (e.g., a TV, a laptop or other personal computer (PC), a tablet or other mobile device, or a gaming device). Playback device 240 can include a display or other user interface configured to display a processed stream of video content. The display may be a flat-panel screen, a plasma screen, a light emitting diode (LED) screen, a cathode ray tube (CRT), a liquid crystal display (LCD), or a projector. Playback devices can also include one or more speakers. In addition, playback device 240 can include an antenna configured to receive audio and video by way of an over-the-air broadcast channel.

Network 270 may be any network that enables communication between devices, such as a wired network and/or a wireless network (e.g., a mobile network). Network 270 can include one or more portions that constitute a private network (e.g., a cable TV network or a satellite TV network) or a public network (e.g., over-the-air broadcast channels or the internet).

Video identification system 250 can communicate with watching station 210 and playback device 240 over network 270. Video identification system 250 may receive a query fingerprint generated from video content by a query fingerprint generator 242 of playback device 240, and query an index of known fingerprints generated by a reference fingerprint generator 212 of watching station 210 in order to identify the video content. The query fingerprint may be a fingerprint of a frame or block of frames within the video content. Video identification system 250 can identify the video content by matching the query fingerprint with one or more reference fingerprints. In some examples, video identification system 250 can be a component or module of playback device 240 or media device 230.

Upon identifying the video content, video identification system 250 can return to playback device 240 an identifier for replacement media content (e.g., alternative programming or alternative commercials) associated with the video content. The replacement media content can be stored in replacement content server 260. Using the identifier, playback device 240 can access the replacement media content from replacement content server 260 and then provide the replacement media content for display. Alternatively, replacement content server 260 or another computing system can send the replacement media content to playback device 240 or media device 230 in advance (e.g., a few seconds, minutes, or hours before media device 230 is scheduled to perform the replacement operation), for storage in a local cache of playback device 240 or media device 230. In this implementation, playback device 240 can access the replacement media content from the local cache, and then provide the replacement media content for display. Employing this local caching technique can help ensure that playback device 240 receives the replacement media content in time to carry out the replacement operation. This can be especially useful in situations where playback device 240 has an unreliable or unpredictable Internet connection, for instance.

In addition, upon identifying the video content, video identification system 250 can return to playback device 240 an identifier of a loudness level profile associated with the video content. The identifier can be an identifier of the video content, for instance. The loudness level profile can be stored at watching station 210, replacement content server 260, or at another computing system. Using the identifier, playback device 240 can access the loudness level profile from, for instance, watching station 210 or replacement content server 260. Alternatively, watching station 210 or another computing system can send the loudness level profile to playback device 240 or media device 230 in advance, for storage in a local cache of playback device 240 or media device 230. In this implementation, playback device 240 can access the loudness level profile from the local cache.

Any of the modules, systems, and/or generators may be located at any of the devices shown in FIG. 2. For example, video identification system 250 can include query fingerprint generator 242. With this arrangement, video identification system 250 can receive frames of video content from playback device 240 and generate the query fingerprints using the frames of video content. As another example, media device 230 and playback device 240 can be integrated together within a single device. Other variations are also possible.

Although the description of DAI system 200 and other portions of this disclosure refer to identifying video content using fingerprinting, the examples are not meant to be limiting. The systems and methods disclosed herein can also identify video content using watermarking. For instance, watching station 210 can embed a watermark within the video content (e.g., an audio watermark or a video watermark). With this approach, playback device 240 can detect the watermark within the video content, and send the watermark to video identification system 250. Or playback device 240 can send frames of video content to video identification system, and video identification system 250 can detect the watermark within the frames of video content. After obtaining the watermark, video identification system 250 can then identify the video content using the watermark, and return to playback device 240 an identifier for replacement media content associated with the video content. Similarly, the systems and methods disclosed herein can identify video content using information embedded in a video stream. For instance, watching station 210 can embed an identifier in side information or ancillary information of a video stream. The identifier could signal a media content replacement event, and playback device 240 could detect this embedded information. As another example, media content replacement events can be triggered by certain closed caption information. Watching station 210 can modify closed caption information of video content to include a text string or sequence of string, which triggers a countdown to the start of a media content replacement event. Playback device 240 could then be configured to look for the text string or sequence of strings, so that playback device 240 can determine when the media content replacement event is to occur.

Figure 3:
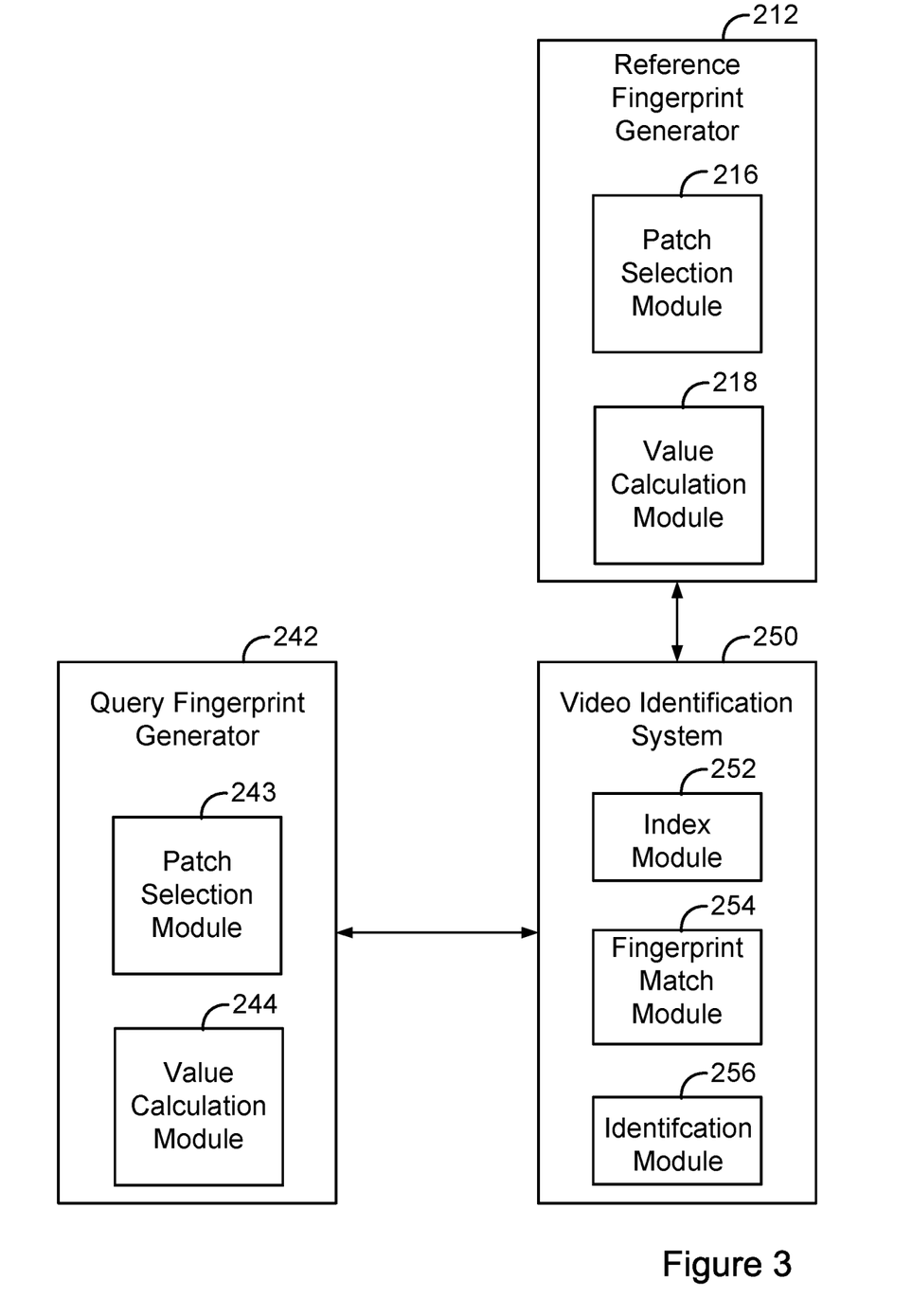
FIG. 3 is a simplified block diagram illustrating components of a reference fingerprint generator, a query fingerprint generator, and a video identification system, according to an example embodiment.

FIG. 3 is a simplified block diagram illustrating components of reference fingerprint generator 212, query fingerprint generator 242, and video identification system 250. As shown in FIG. 3, query fingerprint generator 242 includes a patch selection module 243 and a value calculation module 244, configured to communicate with each other (e.g., via a bus, shared memory, or a switch). Further, video identification system 250 includes an index module 252, a fingerprint match module 254, and an identification module 256, all configured to communicate with each other. Still further, reference fingerprint generator 212 includes a patch selection module 216 and a value calculation module 218, configured to communicate with each other.

One or more of the modules depicted in FIG. 3 can be implemented using hardware (e.g., a processor of a machine, a field-programmable gate array (FPGA), or an application-specific integrated circuit (ASIC), or a combination of hardware and software. Moreover, any two or more of the modules depicted in FIG. 3 can be combined into a single module, and the function described herein for a single module can be subdivided among multiple modules.

In line with the discussion above, query fingerprint generator 242 and reference fingerprint generator 212 can be configured to generate a fingerprint of one or more frames of video content. For example, query fingerprint generator 242 and reference fingerprint generator 212 can calculate values of patches of one or more frames within the video content. Patches can be located at different locations within a frame. Query fingerprint generator 242 and reference fingerprint generator 212 can be configured to combine fingerprints from multiple frames to generate a fingerprint of a block of frames of the video content.

By way of example, patch selection module 243 of query fingerprint generator 242 can be configured to select multiple patches of video content, such as patches associated with one or more regions of a frame or frames within the video content. Similarly, patch selection module 216 of reference fingerprint generator 212 can be configured to select multiple patches of video content, such as patches associated with one or more regions of a frame of frames within the video content.

Patches can be defined by dividing a frame into a grid, such as a 2×2 grid, a 4×3 grid, or a 4×4 grid, and selecting patches based on the grid. For instance, twenty patches may be selected, with four large patches corresponding to quadrants of a frame, and four small patches corresponding to sub-quadrants of each quadrant (i.e. sixteen small patches in total). In some instances, patches may overlap. Further, patches can cumulatively span less than the entirety of a frame.

Value calculation module 244 of query fingerprint generator 242 can be configured to calculate a value for each of the selected multiple patches using, for example, an integral image technique. The integral image technique may calculate the values using a summed area table or other data structure that generates a sum of values of a group of pixels. Similarly, value calculation module 218 of reference fingerprint generator 212 can be configured to calculate a value for each of the selected multiple matches using, for example, an integral imaging technique.

In some examples, value calculation module 244 and value calculation module 218 can calculate a value for a patch by summing the values of a group of pixels with the patch, averaging the values of a group of pixels, or determining a media value of the group of pixels. Additionally or alternatively, value calculation module 244 and value calculation module 218 can calculate a value for a patch by computing differences between values of a group of pixels or computing a linear combination of values of a group of pixels.

Index module 252 of video identification system 250 can be configured to query a database of known reference fingerprints of video content, such as a database of known fingerprints stored within watching station 210 or video identification system 250, in order to identify reference fingerprints potentially matching a query fingerprint. Index module 252 can be configured to query an index of quantized patch values of the known reference fingerprints.

Fingerprint match module 254 of video identification system 250 can be configured to compare a query fingerprint to one or more known reference fingerprints, and determine that the query fingerprint matches at least one known reference fingerprint. For example, fingerprint match module 254 can determine that query fingerprint matches at least one known reference fingerprint by determining that a similarity between the query fingerprint and at least one of the known reference fingerprints satisfies a predetermined threshold. The predetermined threshold can be associated with a Tanimoto distance measurement, a Manhattan distance measurement, or other distance measurements. Additionally or alternatively, fingerprint match module 254 can use other matching techniques, such as Euclidian, Cosine, KL-Divergence, and/or Itakura matching techniques.

Identification module 256, in turn, can be configured to identify video content based on a determination that a query fingerprint(s) matches at least one reference fingerprint(s). For example, identification module 256 can identify the name or title of video content, a location within the video content currently being presented by playback device 240, and/or a channel or broadcaster providing the video content.

Figure 4:
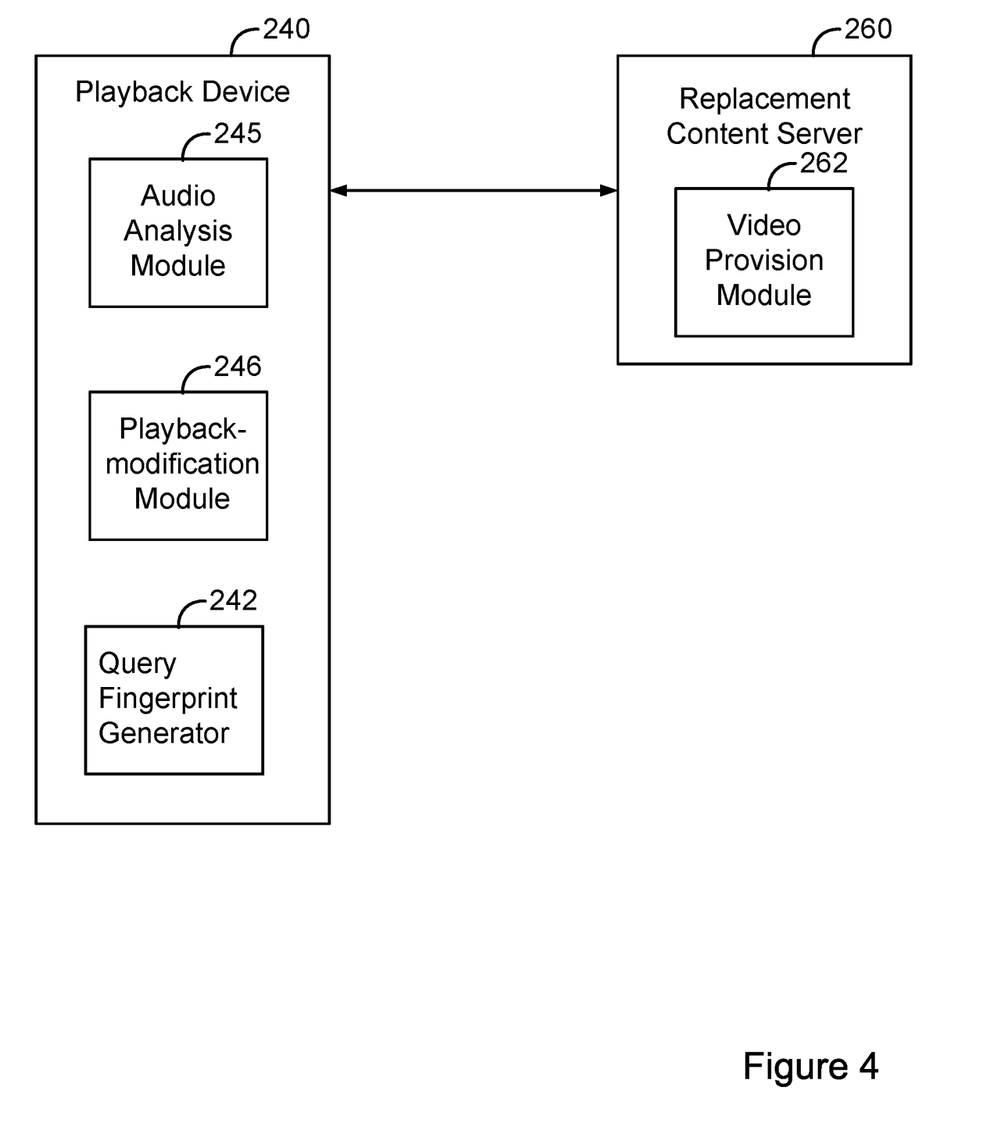
FIG. 4 is a simplified block diagram illustrating components of a playback device and a replacement content server, according to an example embodiment.

FIG. 4 is a simplified block diagram illustrating components of playback device 240 and replacement content server 260. As shown in FIG. 4, in addition to query fingerprint generator 242, playback device 240 includes an audio analysis module 245 and a playback-modification module 246, which can be configured to communicate with each other. Further, replacement content server 260 includes a video provision module 262.

Playback device 240 can encounter a trigger to carry out a media content replacement event. The media content replacement event can involve switching from presenting first media content from a first source to presenting second media content from a second source. The first source can be a first content pipe, and the second source can be a second content pipe that is different from the first content pipe. For instance, the first source can be either an over-the-air antenna or media device 230, and the second source can be either the Internet or a local cache of playback device 240. As a particular example, the first media content can be a first multimedia segment that is received by way of an over-the-air antenna or media device 230, and the second media content can be a second multimedia segment that is received from replacement content server 260 over network 270 and stored in a local cache of playback device 240. Alternatively, the first source can be an over-the-air antenna, and the second source can be media device 230. As another example, the first source can be network 270 (e.g., the first media content can be a multimedia stream), and the second source can be either a local cache of playback device 240 or media device 230.

Encountering the trigger can involve determining that playback device 240 is presenting a first segment that occurs immediately prior to a second segment that is to be replaced. Playback device 240 could determine that the first segment is being presented using any of the fingerprinting or watermarking techniques discussed above. Alternatively, encountering the trigger can involve playback device 240 receiving a replacement command from another device.

Video provision module 262 of replacement content server 260 can provide the second media content to playback device 240. For instance, video identification system 250 can identify video content that playback device 240 is providing for display and, based on the identified video content, video provision module 262 can provide replacement media content corresponding to the video content to playback device 240. Playback device 240 can receive the second media content by way of a network communication interface. For instance, the second media content can be replacement media content that is streamed to playback device 240 over the Internet and then stored in a local cache of playback device 240.

Upon encountering the trigger, playback device 240 can also obtain a loudness level profile for the portion of first media content that playback device 240 will be replacing. For instance, based on video identification system 250 having identified the video content that playback device 240 is providing for display, video identification system 250 can obtain the loudness level profile for the portion of first media content that playback device 240 will be replacing, and provide the loudness level profile to playback device 240. Alternatively, video identification system 250 can provide an identifier to playback device 240, such that playback device 240 can retrieve the loudness level profile from a local cache or another computing system using the identifier.

Responsive to encountering the trigger, playback device 240 can switch from presenting the first media content to presenting the second media content. For example, when playback device 240 encounters a trigger to insert the second media content into a sequence of media content, playback device 240 can retrieve the replacement media content from the local cache, and provide the replacement media content for display using a media player that is configured to display media files. Providing the replacement media content for display using a media player can involve presenting the replacement media content in a media-player layer that is on top of another layer in which other media content is provided for display, such as media content received from a media device or an antenna.

In some instances, providing the second media content for display can involve switching from providing media content that is received from media device 230 or an antenna to providing replacement media content that is stored in a database of playback device 240. Playback device 240 can include a system on a chip that includes a frame buffer. In order to provide the replacement media content for display, the media player of playback device 240 can insert the replacement media content into the frame buffer. Prior to inserting the replacement media content into the frame buffer, the system on a chip may have inserted media content that is received from media device 230 into the frame buffer.

The second media content can include a replacement advertisement. For instance, the second media content can include targeted advertisement that is to be substituted for a generic advertisement. As one example, the targeted advertisement can be a local advertisement, and the generic advertisement can be a national advertisement. As another example, the targeted advertisement can be an advertisement that is selected based on a demographic of a user of playback device 240.

During the media content replacement event, playback device 240 can use the loudness level profile for the first media content to help differentiate loudness level changes that are inherent to the first media content from loudness level changes that are a result of a user-triggered volume adjustment. While playback device 240 presents the second media content, playback device 240 can instruct audio analysis module 245 to determine a loudness level of the first media content that playback device 240 is receiving, and compare the loudness level to the reference loudness level of the content indicated by the loudness level profile. This reference level is the original recorded volume level of the content before the playback device has changed the volume level.

Audio analysis module 245 can be configured to determine the loudness level of the first media content using a time interval having a same length as the time interval that loudness level profile generator 214 used to generate the loudness level profile for the first media content. By way of example, the time interval used by loudness level profile generator 214 can be one second. With this implementation, audio analysis module 245 can be configured to determine loudness levels for one-second portions of the first media content as playback device 240 receives the first media content from the first source. For instance, on a fixed-interval basis, audio analysis module 245 can calculate a loudness level (e.g., root mean square (RMS)) for a recently received portion of the first media content (e.g., the previous one second). Audio analysis module 245 can calculate these loudness levels using a loudness meter or other volume calculation.

To facilitate comparisons between loudness levels determined by audio analysis module 245 and loudness levels indicated by the loudness level profile, audio analysis module 245 can align the loudness level profile with the audio signal that playback device 240 is receiving from the first source. Audio analysis module 245 can perform this alignment in various ways. In one example, audio analysis module 245 can align the loudness level profile to the audio signal using fingerprinting. To align the loudness level profile using fingerprinting, audio analysis module 245 can receive a reference fingerprint corresponding to the loudness level profile and compare the reference fingerprint with query fingerprints derived from the first media content. Each query fingerprint derived from the first media content can have an associated timestamp. Upon determining that the reference fingerprint matches one of the query fingerprints, audio analysis module 245 can use the timestamp associated with the query fingerprint to align the loudness level profile with the audio signal that playback device 240 is receiving. For instance, audio analysis module 245 can be arranged to interpret the matching of the reference fingerprint to the query fingerprint to mean that an initial loudness level of the loudness level profile corresponds to the timestamp associated with the query fingerprint. Or audio analysis module 245 can be arranged to interpret the matching of the reference fingerprint to the query fingerprint to mean that the initial loudness level of the loudness level profile corresponds to a time that is offset from the timestamp associated with the query fingerprint by an offset amount (e.g., one second after the timestamp, two seconds after the timestamp, etc.).

The reference fingerprint used to align the loudness level profile can be an audio fingerprint or a video fingerprint. Playback device 240 can obtain the reference fingerprint from a computing system that provides the loudness level profile to playback device 240, such as watching station 210.

In a similar manner, audio analysis module 245 can align the loudness level profile to the audio signal that the playback device 240 is receiving using a watermark. To align the loudness level profile using a watermark, audio analysis module 245 can receive a watermark corresponding to the loudness level profile. Audio analysis module 245 can then detect that the watermark is present at a particular time within the first media content. Further, audio analysis module 245 can be arranged to interpret the detecting of the watermark at the particular time to mean that an initial loudness level of the loudness level profile corresponds to the particular time. Alternatively, audio analysis module 245 can be arranged to interpret the detecting of the watermark at the particular time to mean that an initial loudness level of the loudness level profile corresponds to a time that is offset from the particular time by an offset amount (e.g., one second after the particular time, two seconds after the particular time, etc.).

After aligning the loudness level profile to the audio signal that playback device 240 is receiving from the first source, audio analysis module 245 can select a reference loudness level from the loudness level profile that corresponds to a loudness level of the audio signal determined by audio analysis module 245. For instance, audio analysis module 245 may have determined that an initial loudness level of the loudness level profile aligns with a time T1 of the audio signal. Further, based on having determined a loudness level for the first media content using a portion of the first media content that occurs five seconds after time T1, audio analysis module 245 can select a reference loudness level of the loudness profile that corresponds to a time that is five seconds after the time to which the initial loudness level corresponds.

After selecting a reference loudness level from the loudness level profile, audio analysis module 245 can then compare the reference loudness level to the determined loudness level on the playback device. In some instances, the determined loudness level and the reference loudness level can be specified on an absolute scale. In other instances, the determined loudness level and the second loudness level can be specified in decibels. The first loudness level and the second loudness level can include perceptual volume weighting such as K-weighting relative to full scale (LKFS).

Based on a result of the difference between these two loudness levels, audio analysis module 245 can determine a target volume for playback device 240. For instance, audio analysis module 245 can determine that the loudness level of the playback device 240 audio signal exceeds the corresponding reference loudness level indicated by the loudness level profile by a first amount, and audio analysis module 245 can determine, as the target volume, a volume that is equal to a sum of a current volume of playback device 240 and the first amount (or a sum of the current volume and a value that is proportional to the first amount). Conversely, audio analysis module 245 can determine that the reference loudness level indicated by the loudness level profile exceeds the loudness level of the playback device 240 audio signal by a second amount, and audio analysis module 245 can determine, as the target volume, a volume that is equal to a difference between the current volume of playback device 240 and the second amount (or a difference between the current volume and a value that is proportional to the second amount).

Playback-modification module 246 can adjust the volume of the playback device toward the target volume while playback device 240 presents the second media content in place of the first media content. For instance, audio analysis module 245 can provide the target volume to playback-modification module 246, and playback-modification module 246 can gradually adjust the volume of the playback device toward the target volume using a smoothing filter. Using a smoothing filter allows for adjusting the volume of the playback device from a current volume to the target volume in less than a second (e.g., over the course of one hundred milliseconds). In this manner, playback-modification module 246 can adjust the volume of playback device 240 to account for a user-triggered volume adjustment, such as a volume adjustment that is triggered by transmitting an instruction from a remote control to media device 230 after the replacement media has begun playback. In a similar manner, during the course of the media content replacement event, playback device 240 can make subsequent comparisons between determined loudness levels and reference loudness levels, and perform subsequent adjustments to the volume of the playback device.

In some examples, audio analysis module 245 can detect that the audio signal of the first media content rapidly and unexpectedly becomes very low/muted for a longer than normal time (e.g., longer than the length of short pauses in spoken content). Based on detecting such a pause, playback-modification module 246 can mute the audio signal of the second media content. In this manner, if the user mutes the first media content (e.g., using a remote control of media device 230) during the media content replacement event, playback device 240 can also mute the second media content that is presented in place of the first media content.

In some examples, before playback of the second media content, audio analysis module 245 can use the loudness level profile of the first media content to determine an adjustment to the loudness of the second media content. For instance, audio analysis module 245 can determine that an overall loudness level for the replacement media exceeds the difference between the loudness level of the playback device 240 which is playing the first media content and the reference loudness level indicated by the loudness level profile of the first media. The replacement media's volume will then be lowered by the amount that the replacement media's loudness level exceeds this difference with the first media volume analysis and this amount will be used as a target volume for playback device 240. Conversely, audio analysis module 245 can determine that the difference between the reference loudness level indicated by the loudness level profile of the first media and the actual volume level indicated on the playback device 240 is greater than the loudness level reference of the replacement media, and audio analysis module 245 can determine a volume that raises the replacement media volume by the amount that the replacement is lower than this difference with the first media volume analysis. Once again, this level will be used as the target volume for playback device 240 when the replacement media playback begins. For purposes of this disclosure, adjusting the loudness level of a media content is synonymous with adjusting the audio volume level of a media content. Accordingly, an adjustment to a volume does not necessarily have to involve psychoacoustic weighting of the spectrum.

III. Example Operations

Figure 5:
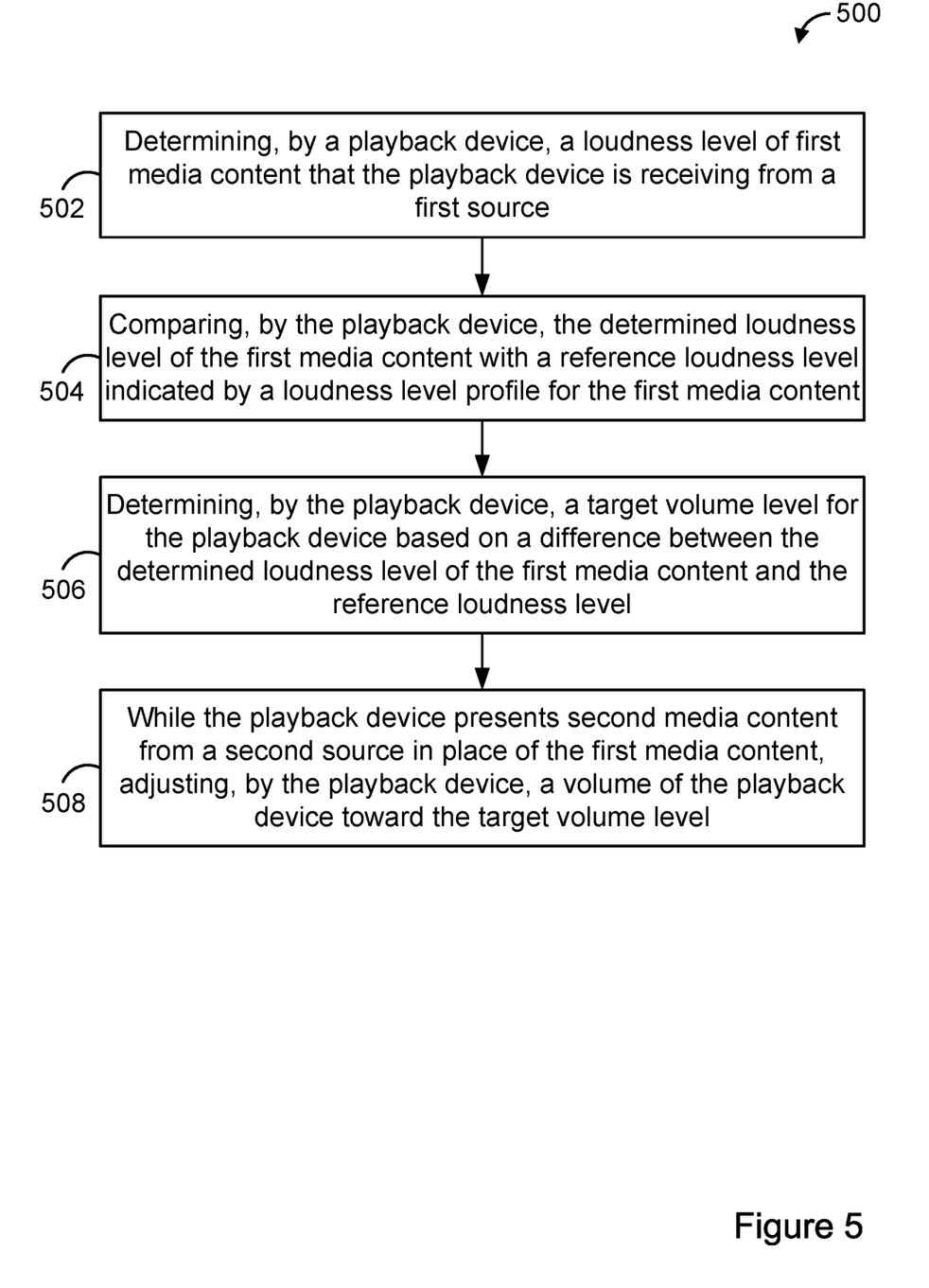
FIG. 5 is a flow chart of an example method.

FIG. 5 is a flow chart of an example method 500. Method 500 can be carried out by a playback device, such as playback device 240 or more generally, by a computing system. At block 502, method 500 includes determining, by a playback device, a loudness level of first media content that the playback device is receiving from a first source. At block 504, method 500 includes comparing, by the playback device, the determined loudness level of the first media content with a reference loudness level indicated by a loudness level profile for the first media content. At block 506, method 500 includes determining, by the playback device, a target volume level for the playback device based on a difference between the determined loudness level of the first media content and the reference loudness level. And at block 508, method 500 includes, while the playback device presents second media content from a second source in place of the first media content, adjusting, by the playback device, a volume of the playback device toward the target volume level.

IV. Example Variations

Although some of the acts and/or functions described in this disclosure have been described as being performed by a particular entity, the acts and/or functions can be performed by any entity, such as those entities described in this disclosure. Further, although the acts and/or functions have been recited in a particular order, the acts and/or functions need not be performed in the order recited. However, in some instances, it can be desired to perform the acts and/or functions in the order recited. Further, each of the acts and/or functions can be performed responsive to one or more of the other acts and/or functions. Also, not all of the acts and/or functions need to be performed to achieve one or more of the benefits provided by this disclosure, and therefore not all of the acts and/or functions are required.

Although certain variations have been discussed in connection with one or more examples of this disclosure, these variations can also be applied to all of the other examples of this disclosure as well.

Although select examples of this disclosure have been described, alterations and permutations of these examples will be apparent to those of ordinary skill in the art. Other changes, substitutions, and/or alterations are also possible without departing from the invention in its broader aspects as set forth in the following claims.

The invention claimed is:
1. A method comprising:
obtaining, by a playback device, a loudness level profile for a replaceable content segment;
aligning, by the playback device, the loudness level profile with an audio signal corresponding to the replaceable content segment;

while the playback device is presenting a replacement content segment in place of the replaceable content segment, detecting, by the playback device, a user-triggered volume adjustment using the loudness level profile; and based on detecting the user-triggered volume adjustment, carrying out, by the playback device, a corresponding adjustment to a volume of the playback device.

2. The method of claim 1, wherein the loudness level profile characterizes changes in loudness within the replaceable content segment over time and comprises respective loudness levels for different portions of the replaceable content segment.

3. The method of claim 1, wherein aligning the loudness level profile with the audio signal comprises aligning the loudness level profile with the audio signal using fingerprinting.

4. The method of claim 3, wherein aligning the loudness level profile with the audio signal comprises:

deriving a query fingerprint from the replaceable content segment;

matching the query fingerprint to a reference fingerprint of the loudness level profile; and using a timestamp associated with the query fingerprint to align the loudness level profile with the audio signal.

5. The method of claim 1, wherein aligning the loudness level profile with the audio signal comprises aligning the loudness level profile with the audio signal using a watermark.

6. The method of claim 1, wherein detecting the user-triggered volume adjustment comprises:

determining a loudness level of a portion of the replaceable content segment; and comparing the loudness level with a reference loudness level indicated by the loudness level profile.

7. The method of claim 1, wherein the playback device comprises a television, and wherein presenting the replacement content segment comprises presenting a replacement advertisement.

8. A non-transitory computer-readable medium having stored thereon program instructions that upon execution by a processor, cause performance of a set of acts comprising:

obtaining a loudness level profile for a replaceable content segment;

aligning the loudness level profile with an audio signal corresponding to the replaceable content segment;

while a playback device is presenting a replacement content segment in place of the replaceable content segment, detecting a user-triggered volume adjustment using the loudness level profile; and based on detecting the user-triggered volume adjustment, carrying out a corresponding adjustment to a volume of the playback device.

9. The non-transitory computer-readable medium of claim 8, wherein the loudness level profile characterizes changes in loudness within the replaceable content segment over time and comprises respective loudness levels for different portions of the replaceable content segment.

10. The non-transitory computer-readable medium of claim 8, wherein aligning the loudness level profile with the audio signal comprises aligning the loudness level profile with the audio signal using fingerprinting.

11. The non-transitory computer-readable medium of claim 10, wherein aligning the loudness level profile with the audio signal comprises:

deriving a query fingerprint from the replaceable content segment;

matching the query fingerprint to a reference fingerprint of the loudness level profile; and using a timestamp associated with the query fingerprint to align the loudness level profile with the audio signal.

12. The non-transitory computer-readable medium of claim 8, wherein aligning the loudness level profile with the audio signal comprises aligning the loudness level profile with the audio signal using a watermark.

13. The non-transitory computer-readable medium of claim 8, wherein detecting the user-triggered volume adjustment comprises:

determining a loudness level of a portion of the replaceable content segment; and comparing the loudness level with a reference loudness level indicated by the loudness level profile.

14. A computing system configured for performing a set of acts comprising:

obtaining a loudness level profile for a replaceable content segment;

aligning the loudness level profile with an audio signal corresponding to the replaceable content segment;

while a playback device is presenting a replacement content segment in place of the replaceable content segment, detecting a user-triggered volume adjustment using the loudness level profile; and based on detecting the user-triggered volume adjustment, carrying out a corresponding adjustment to a volume of the playback device.

15. The computing system of claim 14, wherein the loudness level profile characterizes changes in loudness within the replaceable content segment over time and comprises respective loudness levels for different portions of the replaceable content segment.

16. The computing system of claim 14, wherein aligning the loudness level profile with the audio signal comprises aligning the loudness level profile with the audio signal using fingerprinting.

17. The computing system of claim 16, wherein aligning the loudness level profile with the audio signal comprises:

deriving a query fingerprint from the replaceable content segment;

matching the query fingerprint to a reference fingerprint of the loudness level profile; and using a timestamp associated with the query fingerprint to align the loudness level profile with the audio signal.

18. The computing system of claim 14, wherein aligning the loudness level profile with the audio signal comprises aligning the loudness level profile with the audio signal using a watermark.

19. The computing system of claim 14, wherein detecting the user-triggered volume adjustment comprises:

determining a loudness level of a portion of the replaceable content segment; and comparing the loudness level with a reference loudness level indicated by the loudness level profile.

20. The computing system of claim 14, wherein the playback device comprises a television, and wherein presenting the replacement content segment comprises presenting a replacement advertisement.

* * * * *